United States Patent [19]

Chan et al.

[11] Patent Number: 5,683,924
[45] Date of Patent: Nov. 4, 1997

[54] METHOD OF FORMING RAISED SOURCE/ DRAIN REGIONS IN A INTEGRATED CIRCUIT

[75] Inventors: Tsiu C. Chan; Gregory C. Smith, both of Carrollton, Tex.

[73] Assignee: SGS-Thomson Microelectronics, Inc., Carrollton, Tex.

[21] Appl. No.: 486,347

[22] Filed: Jun. 7, 1995

Related U.S. Application Data

[63] Continuation-in-part of Ser. No. 331,691, Oct. 31, 1994, abandoned.
[51] Int. Cl.⁶ .................................................. H01L 21/265
[52] U.S. Cl. ........................... 437/44; 437/41; 437/186
[58] Field of Search ............................... 437/21, 41, 44, 437/200, 186

[56] References Cited

U.S. PATENT DOCUMENTS

| | | | |
|---|---|---|---|
| 4,450,620 | 5/1984 | Fuls et al. | 29/571 |
| 4,775,644 | 10/1988 | Szeto | 437/69 |
| 4,807,013 | 2/1989 | Manocha | 357/59 |
| 4,841,347 | 6/1989 | Hsu | 357/23.9 |
| 4,859,620 | 8/1989 | Wei et al. | 437/44 |
| 4,868,138 | 9/1989 | Chan et al. | 437/44 |
| 4,937,643 | 6/1990 | Deslauriers et al. | 357/23.8 |
| 4,940,509 | 7/1990 | Tso et al. | 156/653 |
| 4,948,745 | 8/1990 | Pfiester et al. | 437/41 |
| 5,079,180 | 1/1992 | Rodder et al. | 437/44 |
| 5,118,639 | 6/1992 | Roth et al. | 437/41 |
| 5,141,891 | 8/1992 | Arima et al. | 437/44 |
| 5,158,903 | 10/1992 | Hori et al. | 437/45 |
| 5,182,619 | 1/1993 | Pfiester | 257/382 |
| 5,192,992 | 3/1993 | Kim et al. | 257/370 |
| 5,241,193 | 8/1993 | Pfiester et al. | 257/67 |
| 5,242,847 | 9/1993 | Ozturk et al. | 437/41 |
| 5,319,232 | 6/1994 | Pfiester | 257/67 |
| 5,341,016 | 8/1994 | Prall et al. | 257/412 |
| 5,365,081 | 11/1994 | Yamazaki et al. | 257/67 |
| 5,496,750 | 3/1996 | Moslehi | 437/41 |
| 5,504,031 | 4/1996 | Hsu et al. | 437/57 |

FOREIGN PATENT DOCUMENTS

| | | |
|---|---|---|
| 3636249 | 5/1987 | Germany. |
| 60-103671 | 11/1983 | Japan. |

OTHER PUBLICATIONS

Rodder, et al., "Raised Source/Drain MOSFET with Dual Sidewall Spacers", IEEE Electron Device Letters 12 (1991) Mar., No. 3, New York.

Wong, et al., "Elevated Source/Drain Mosfet", 1984 International Electron Devices Meeting, Dec. 9–12, 1984, IEDM, pp. 634–637.

1046B Extended Abstracts/Spring Meeting 88–1 (1988), May 15–20, Princeton, NY, p. 301.

Queirolo, et al., "Dopant Activation, Carrier Mobility, and TEM Studies in Polycrystalline Silicon Films", *J. Electrochem. So.*, V. 137, No. 3, Mar., 1990, pp. 967–970.

C.S. Pai, et al., "Chemical IVapor Deposition of Selective Epitaxial Silicon Layers", *J. Electrochem. Soc.*, V. 137, No. 3, Mar., 1990, pp. 971–976.

*Primary Examiner*—John Niebling
*Assistant Examiner*—Richard A. Booth
*Attorney, Agent, or Firm*—Theodore E. Galanthay; Lisa K. Jorgenson

[57] ABSTRACT

A method is provided for forming a planar transistor of a semiconductor integrated circuit, and an integrated circuit formed according to the same. A plurality of field oxide regions are formed overlying a substrate electrically isolating a plurality of transistors encapsulated in a dielectric. LDD regions are formed in the substrate adjacent the transistors and the field oxide regions. Doped polysilicon raised source and drain regions are formed overlying the LDD regions and a tapered portion of the field oxide region and adjacent the transistor. These polysilicon raised source and drain regions will help to prevent any undesired amount of the substrate silicon from being consumed, reducing the possibility of junction leakage and punchthrough as well as providing a more planar surface for subsequent processing steps.

21 Claims, 4 Drawing Sheets

METHOD OF FORMING RAISED SOURCE/DRAIN REGIONS IN A INTEGRATED CIRCUIT

This application is a continuation-in-part application of U.S. patent application Ser. No. 08/331,691, filed Oct. 31, 1994 and now abandoned and is related to co-pending U.S. patent application Ser. No. 08/480,857, filed on the same day herewith, Jun. 7, 1995, all of the above applications assigned to SGS-THOMSON Microelectronics, Inc. and incorporated herein by reference.

FIELD OF THE INVENTION

The present invention relates generally to semiconductor integrated circuit processing, and more specifically to an improved method of forming planarized transistors by forming raised source and drain regions while reducing junction leakage and preventing shorting conditions.

BACKGROUND OF THE INVENTION

As is well known in the field of integrated circuit design, layout and fabrication, the manufacturing cost of a given integrated circuit is largely dependent upon the chip area required to implement desired functions. The chip area, in turn, is defined by the geometries and sizes of the active components such as gate electrodes in metal-oxide-semiconductor (MOS) technology, and diffused regions such as MOS source and drain regions and bipolar emitters and base regions. These geometries and sizes are often dependent upon the photolithographic resolution available for the particular manufacturing facility. The goal of photolithography in establishing the horizontal dimensions of the various devices and circuits is to create a pattern which meets design requirements as well as to correctly align the circuit pattern on the surface of the wafer. As line widths shrink smaller and smaller in submicron photolithography, the process to print lines and contact holes in photoresist becomes increasingly more difficult.

With circuit advancement to the ultra-large-scale integration (ULSI) levels, more and more layers are added to the surface of the wafer. These additional layers in turn create more steps on the wafer surface. The resolution of small image sizes in photolithography thus becomes more difficult over the additional steps because it becomes more difficult due to the increased problem of depth of focus. Planarization techniques become increasingly more important to offset the effects of a varied topography.

The formation of contact structures as transistor dimensions decrease is also important to predict and control device performance. A variety of contact structures have been considered to alleviate various problems such as contact resistance and the maximum area of devices available, such as the areas of source and drain regions, in order to make full contact to the devices with the contact structures. Self-aligned silicides are one alternative for alleviating contact area and resistivity problems associated with contacting source and drain regions. In addition, the self-aligned silicides make the diffused regions more conductive and lowers the sheet resistance of the diffused regions. This self-aligned process is shown with reference to FIGS. 1 and 2. After the transistor 14 is formed having gate oxide 16 and polysilicon or polycide gate electrode 18, the lightly doped drain (LDD) regions 22 are formed by conventional methods by implanting a light dose at the edge of the gate electrode near the channel to overcome such problems as hot-carrier effects. Sidewall oxide spacers 20 are formed along the edge of the gate electrode and gate oxide. The source/drain regions 24 are implanted with a heavier dose to form the source/drain junctions.

A metal 26 is deposited over the integrated circuit after which the wafer is heated. The silicon in the source/drain regions 24 then reacts with the metal 26 to form a silicide 28 as shown in FIG. 2. This process is called salicide if the silicide over the source/drain regions is formed at the same time as the silicide 30 over the polysilicon gate electrode. Everywhere there is silicon, the metal will react to form a silicide (the source/drain regions in area 28 and the polysilicon in region 30). Elsewhere the metal remains unreacted and is selectively removed. A dielectric layer is typically formed over the integrated circuit with contact openings formed to the source/drain regions and the polysilicon gate. The openings are generally filled with a metal to make contact to the silicide regions 28 and 30.

The refractory metals including titanium, tungsten, tantalum and cobalt have proven well-suited for use as the metal with which to form the silicide since the reaction with silicon occurs at relatively low processing temperatures, for example, 600° C. or less. There are, however, disadvantages with this process of silicide formation. First, the silicide formation consumes a portion of the substrate silicon thus reducing the integrity of the source/drain regions. Second, titanium is commonly used for the silicide metal because of its low resistivity. However, during titanium disilicide formation, silicon tends to diffuse into the titanium which then may react over top of the sidewall oxide spacers. If silicide is formed over the oxide spacers it is continuous between the silicide formed over the polysilicon gate and the source/drain regions which will cause shorting between the gate electrode and the source/drain regions.

It is therefore an object of the present invention to provide a method of forming a planarized transistor having raised source and drain regions.

It is a further object of the present invention to provide such a method of forming the planarized transistors with raised source and drain regions with reduced resistivity.

It is a further object of the present invention to provide such a method of forming the raised source and drain regions in a manner which reduces junction leakage and reduces shorting between the gate and source/drain regions.

Other objects and advantages of the present invention will be apparent to those of ordinary skill in the art having reference to the following specification together with the drawings.

SUMMARY OF THE INVENTION

The invention may be incorporated into a method for forming a semiconductor device structure, and the semiconductor device structure formed thereby. A gate electrode is formed over a gate oxide overlying a substrate. The gate electrode is electrically isolated by a plurality of field oxide regions. A capping layer is formed over the gate electrode. LDD regions are formed in the substrate adjacent to the gate electrode and sidewall spacers are formed adjacent to the gate electrode and capping layer. A polysilicon layer is deposited over the capping layer, substrate and field oxide regions, wherein the lowest most portion of the upper surface of the polysilicon layer is above the upper surface of the field oxide region, and preferably above the upper surface of the gate electrode and capping layer. A planar sacrificial layer is formed over the polysilicon layer having a 1:1 etch ratio with the polysilicon layer. An etch is performed of the sacrificial and the polysilicon layers exposing the upper surface of the field oxide. The polysilicon is then doped to a desired doping level.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 3:
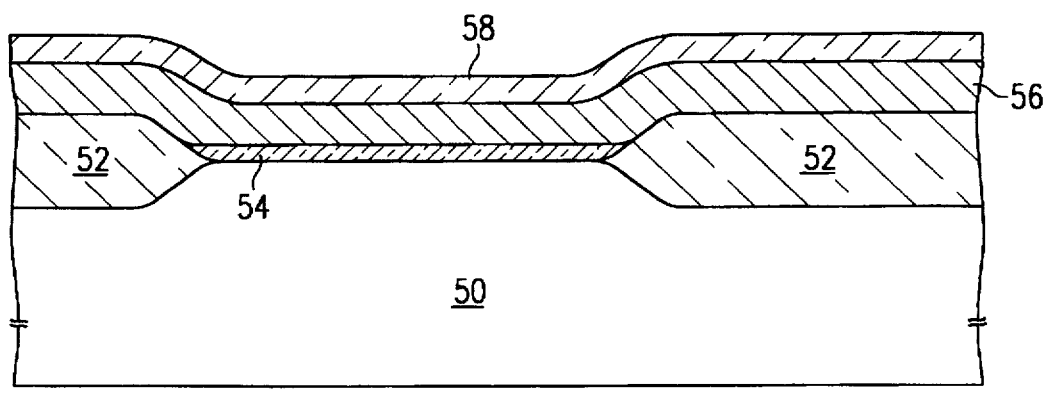
FIGS. 3–6 are cross sectional views of the fabrication of a semiconductor integrated circuit according to one embodiment of the present invention.

Referring now to FIGS. 3–6, a preferred embodiment of the present invention will now be described in detail. FIG. 3 illustrates a portion of a wafer, in cross-section, which has a surface at which isolation structures and devices in adjacent active areas are to be formed. As shown in FIG. 3, an integrated circuit is to be formed on a silicon substrate 50. The silicon substrate may be p- or n- doped silicon depending upon the location in the wafer where the isolation and active devices are to be formed. Field oxide regions 52 are formed on various portions of the wafer to isolate the active areas where devices will be formed. After various conventional processing steps have been performed if necessary to remove any nitride formed under the field oxide regions, such as a sacrificial oxide layer, a gate oxide layer 54 is thermally grown over the silicon substrate 50 to a depth of approximately 20 to 300 angstroms. A polysilicon layer 56 is formed over the oxide layer 54 and field oxide regions 52 to a depth of between approximately 1000–6000 angstroms. A dielectric capping layer 58 such as oxide or nitride is then formed over the polysilicon layer 56 to a depth of between approximately 1000 to 2000 angstroms.

Figure 4:
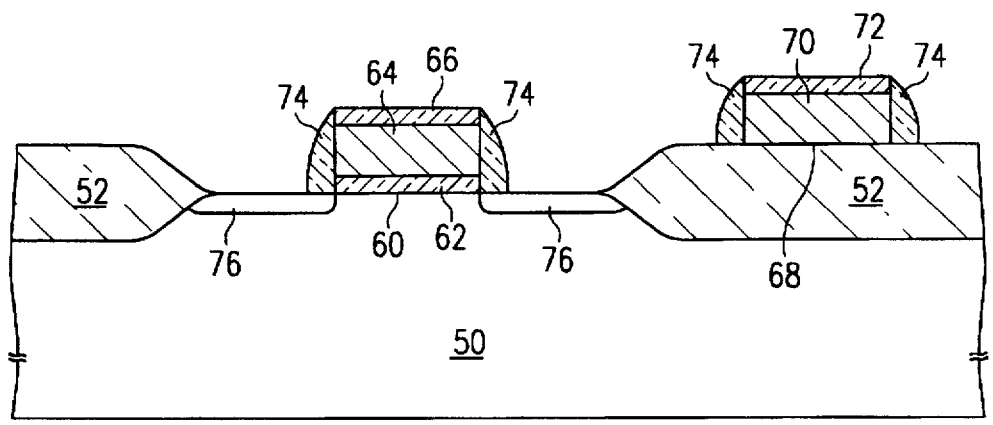

Referring to FIG. 4, the gate oxide 54, polysilicon layer 56 and oxide capping layer 58 are then patterned and etched to form gates of transistors 60 and interconnect lines 68. Transistor 60 comprises gate oxide 62, polysilicon gate electrode 64 and dielectric capping layer 66. Gate electrode 64 may alternatively comprise a silicide of between approximately 1000 to 2000 angstroms overlying the polysilicon layer. The silicide will help to reduce the sheet resistance of the polysilicon gate. Lightly doped drain and source regions 76 are formed, typically with a phosphorous implant in the silicon substrate adjacent to the edge of the gate electrode 64. Sidewall oxide spacers 74 are then formed along the edge of the transistor gate. However, with the capping layer 66 overlying the gate electrode 64, the sidewall spacers 74 will also form along the side of the capping layer 66.

Interconnect 68 is formed over the field oxide region 52 from the same polysilicon layer 56 as that used to form gate electrode 64. After the patterning and etching step, the dielectric capping layer 72 remains over the polysilicon interconnect 70. A silicide may also be formed over the polysilicon underlying the capping layer to reduce the sheet resistance. Sidewall oxide spacers 74 are also formed along the edge of the interconnect 68.

Figure 5:
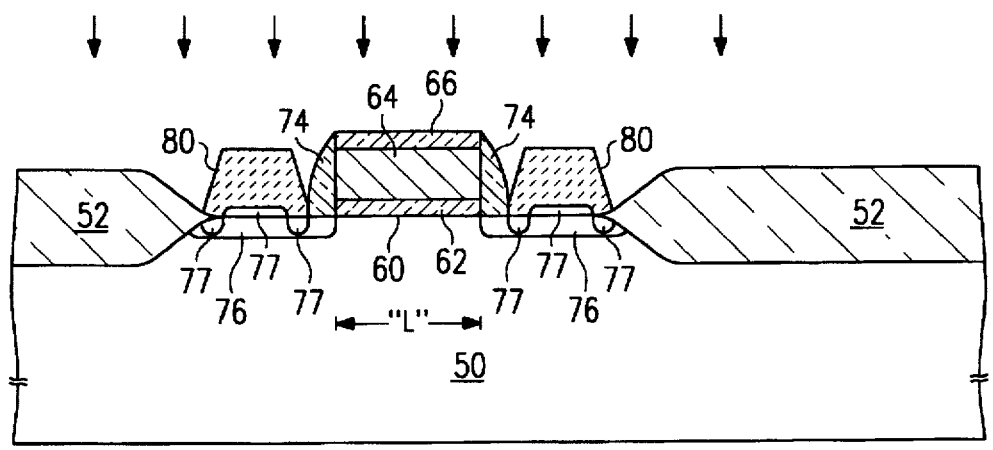

Referring to FIG. 5, only the transistor gate 60 is shown for ease of understanding the present invention. Regions of epitaxy 80 are selectively grown over the source and drain regions 76. As indicated by the article incorporated herein by reference by C. S. Pal et al., titled "Chemical Vapor Deposition of Selective Epitaxial Silicon Layers," J. Electrochem. Soc., Vol. 137, No. 3, March 1990, epitaxial growth of silicon can be selectively grown on the exposed silicon substrate without encroachment occurring on the surrounding regions of oxide. In FIG. 5, the growth of the epitaxial silicon 80 will thus be above the source/drain regions 76. The epitaxial regions 80 will form over the source/drain regions 76. While some faceting occurs along the sides of the epitaxial region during growth, there may also be some lateral formation of the epitaxial regions 80 over the field oxide or sidewall oxide spacers. Any lateral growth is at least partially the result of the upward growth of the epitaxy over the silicon substrate. Preferably, an upper surface of the epitaxial regions will be formed to a height above the silicon substrate substantially planar with an upper surface of the gate electrode 64.

Epitaxial regions 80 will be implanted with an $N^+$ or $P^+$ dopant as shown by the arrows in FIG. 5. The epitaxial regions need to be implanted with sufficient energy and dose to achieve continuity with the LDD implant in the substrate. The dopant atoms will diffuse into the silicon in essentially the same shape as the epitaxial regions 80 to form the $N^+$ or $P^+$ source/drain junctions 77 within at least a portion of regions 76. Typically, the more heavily doped source/drain regions have a deeper junction than the LDD regions as shown by the source/drain regions 24 in FIG. 1. While the same depth may be achieved in the present invention, alternatively, the source/drain regions 77 may have the same or less junction depth in the deepest portion than the LDD regions already formed.

Figure 1:
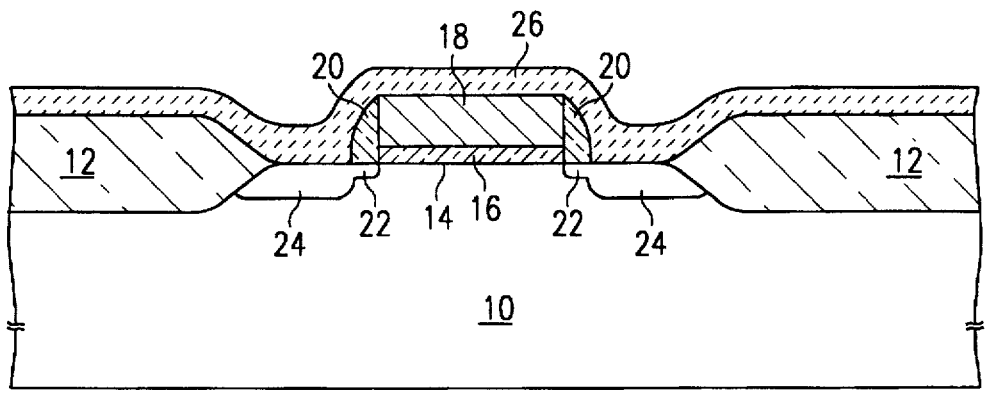
FIGS. 1–2 are cross sectional views of the fabrication of a semiconductor integrated circuit according to the prior art.
Figure 2:
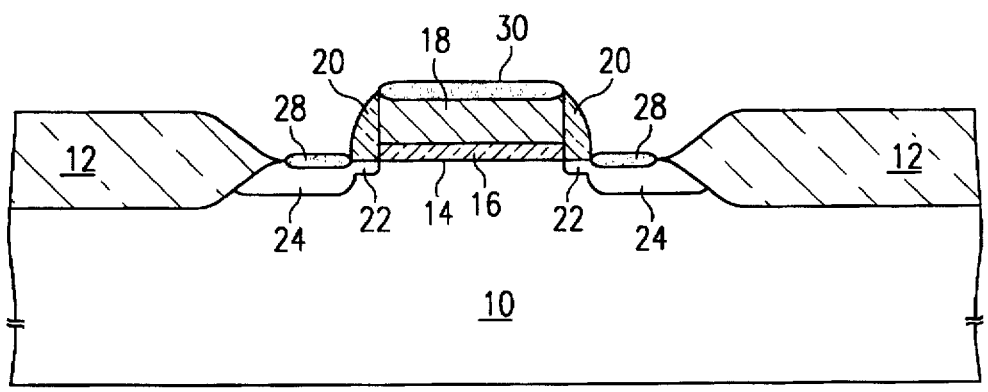

LDD regions may typically form to a depth of approximately 1000 angstroms. In NMOS devices, the dose required for this depth would normally be approximately $1-4 \times 10^{13}$ atoms/cm$^2$ of phosphorous. With a standard source/drain diffusion, as shown in FIG. 1, the second more heavily doped source and drain regions junctions are formed to a depth of approximately 1500 angstroms below the silicon surface. In NMOS devices, the implant is typically arsenic at a dose of about $5 \times 10^{15}$ atoms/cm$^2$. The depth of the source and drain regions can be made deeper than the LDD regions without impacting device performance since the more heavily doped source/drain regions are further away from the channel. Using a normal salicide process as shown in FIG. 2, the silicide formation 28 consumes a portion of the source and drain regions 24, approximately 700 angstroms of the 1500 angstroms. If a large enough amount of silicon is consumed, undesired results may be obtained, for example, there may be a low or leaky drain to substrate diode breakdown voltage and the silicide may encroach into the LDD regions effectively reducing the device integrity.

In the present invention, as shown in FIG. 5, the raised source/drain regions 80 formed from selectively growing an epitaxial layer will prevent any lateral diffusion of silicide in the source/drain regions. As the more heavily doped source/drain regions 77 are formed through the epitaxial regions 80, they can be kept to a depth less than or approximately equal to the depth of the LDD. With a shallower source/drain region, the width of the gate, thus the length of the channel "L", may be shortened without adversely affecting device performance. For example, if the standard submicron gate width is 0.5 microns, this process may allow reduction of the gate width to between 0.2 to 6.4 microns. Reducing the gate width has obvious advantages in submicron processing technology such as increasing switching speeds and allowing for a higher packing density of transistors on the chip.

Figure 6:
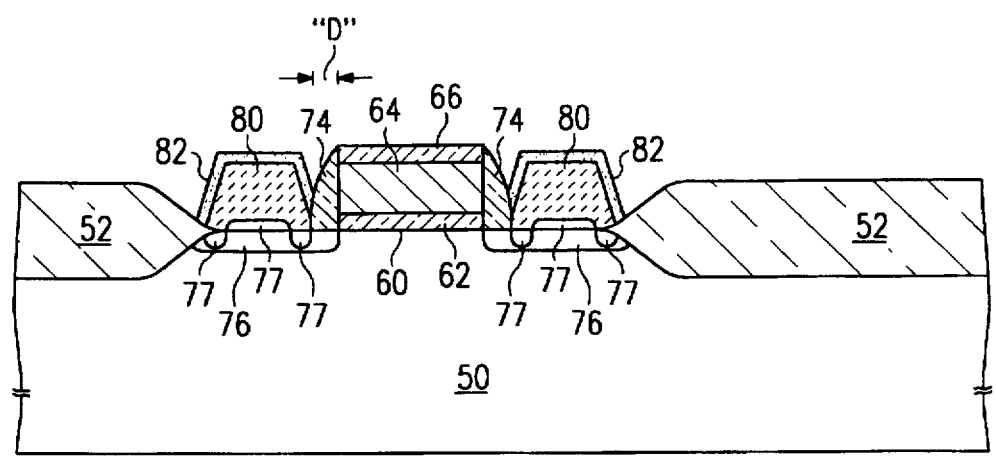

Referring to FIG. 6, a metal layer, such as a refractory metal layer, is formed over the integrated circuit. The wafer is heated to react the metal with the underlying epitaxial silicon in regions 80 to form a silicide 82. Silicide 82 will lower the resistivity of the raised source and drain regions 80. The raised source/drain epitaxial regions 80 will prevent any undesired amount of the substrate silicon from being consumed. The possibility of junction leakage and punchthrough are substantially reduced. With the raised source/drain epitaxial regions 80 substantially planar with the upper portion of the gate electrode 64, the capping layer 66 and sidewall oxide spacers 74 will electrically isolate the raised source and drain epitaxial regions 80 from the gate electrode 64 to prevent shorting between the gate and source/drain regions. A minimum thickness of the capping layer 66 and sidewall oxide spacers 74 needs to be maintained to provide adequate electrical separation as shown by "D" in FIG. 6. The raised epitaxial regions with silicide provide for more thermal stability as compared to a conventional salicide process for subsequent high temperature processing steps.

Figure 7:
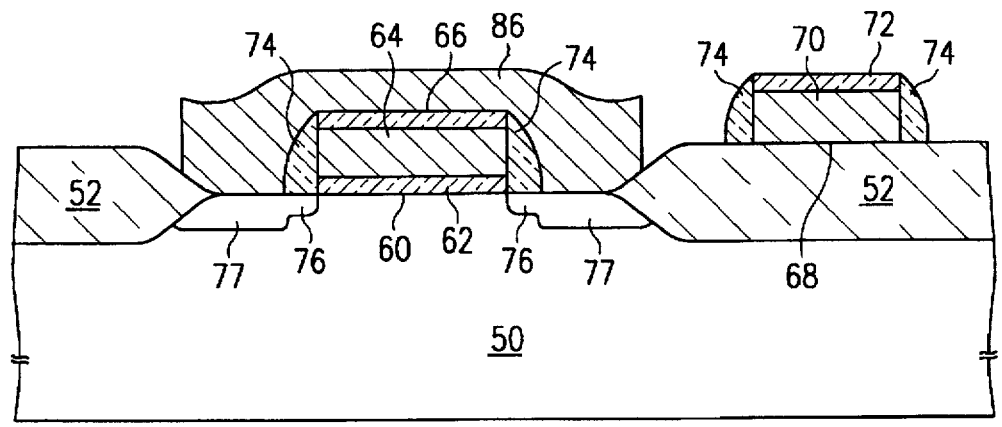
FIGS. 7–8 are cross sectional views of the fabrication of a semiconductor integrated circuit according to a first alternative embodiment of the present invention.
Figure 8:
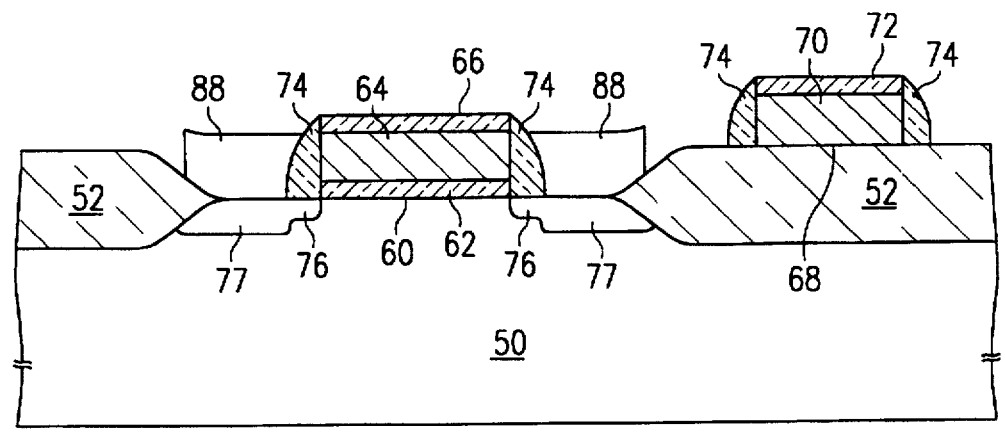

Referring to FIGS. 7-8, a first alternative embodiment is shown. The same reference numerals are used for similar regions as above with reference to FIGS. 3-6. In this embodiment, the $N^+$ or $P^+$ heavily doped source and drain regions 77 are formed by conventional methods after the sidewall oxide spacers are formed and before the raised source/drain regions are formed. The junction of the source/drain regions 77 will typically be deeper than the LDD regions 76 as described above with reference to FIGS. 1 and 2. To form raised source/drain regions, a suitable metal layer, for example tungsten, is formed over the integrated circuit, preferably to a height greater than the polysilicon stacks which include the transistor 60 and interconnect 68. The metal layer is patterned and etched to form a metal region 86 overlying the transistor 60 and source and drain regions 77.

Referring to FIG. 8, a portion of the metal layer 86 is etched away to form raised source/drain regions 88 overlying the source and drain regions 77 and exposing a portion of the capping layer 66 and sidewall oxide spacers 74. Removal of the metal layer may be by any acceptable method of planarization, for example, reactive ion etching selective to the metal chosen, sacrificial etch back by wet or dry techniques or chemical mechanical polishing (CMP). If a standard etch back process is used, it is preferable to use an etchant with a high selectivity of etching the metal over the oxide such as the field oxide, capping layer or sidewall oxide spacers. The metal is preferably etched until the upper portion of the raised source/drain regions 88 is substantially the same height above the silicon substrate as the upper portion of the gate electrode 64. As with the selectively grown epitaxial raised source/drain regions described above, this will provide for a more planar device for subsequent processing steps. In addition, the metal raised source/drain regions will eliminate the need for siliciding the source/drain regions 77 in the substrate, thus reducing the possibility of junction leakage and punchthrough.

Figure 9:
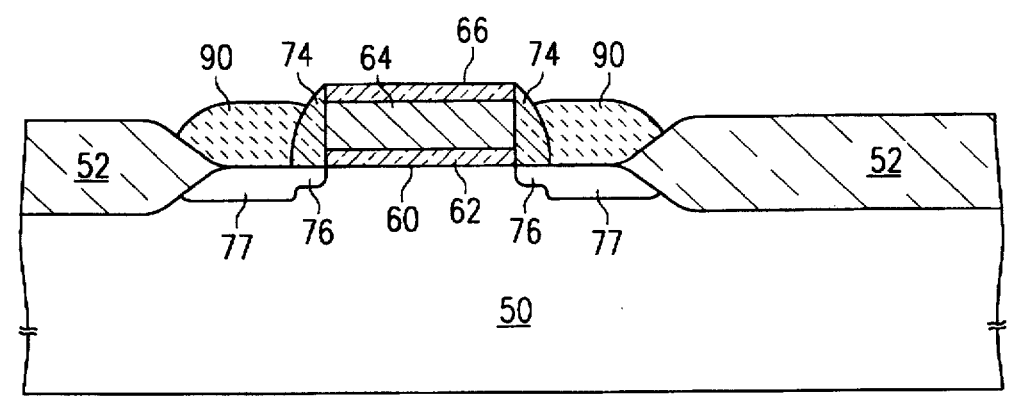
FIG. 9 is a cross sectional view of the fabrication of a semiconductor integrated circuit according to a second alternative embodiment of the present invention.

Referring to FIG. 9, a second alternative embodiment is shown, again with similar reference numerals as those described above for similar regions. In this embodiment, the $N^+$ or $P^+$ heavily doped source and drain regions 77 are formed by conventional methods after the sidewall oxide spacers are formed and before the raised source/drain regions are formed. As with the first alternative embodiment described above with reference to FIG. 7, the junction of the source/drain regions 77 will typically be deeper than the LDD regions 76. Regions of metal 90 are selectively deposited over the source/drain regions 77. The metal is preferably a refractory metal, for example, titanium or tungsten. Selective metal deposition may grow a thin layer of metal silicide over the source/drain regions 77 which may consume a portion of the substrate silicon. While any excessive amount of silicon consumption is not desired, this portion of the selective metal formation acts as a diffusion barrier as the remaining metal continues to be selectively grown over the source/drain regions. The metal regions may be deposited to a height substantially planar with the upper surface of the gate 64 of transistor 60, thus reducing the need for an etch back step. While there may be some faceting with the selectively grown epitaxial regions as described above with reference to the preferred embodiment, the selectively deposited metal will form a more planar upper surface.

Figure 10:
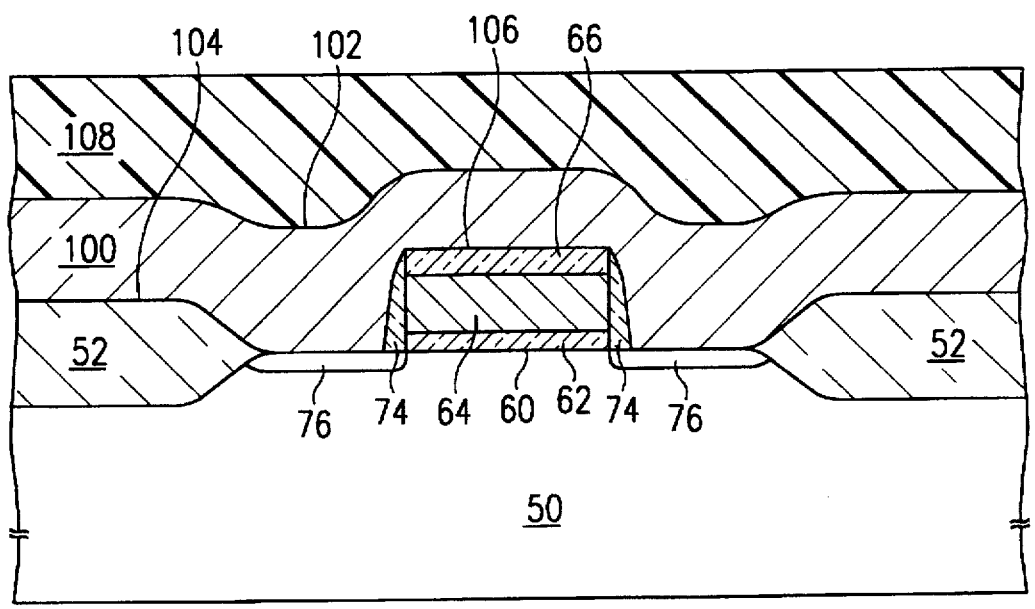
FIGS. 10–11 are cross sectional views of the fabrication of a semiconductor integrated circuit according to yet another alternative embodiment of the present invention.

An additional alternative embodiment of the present invention will now be described in detail with reference to FIGS. 10-11. Similar reference numerals will be used for similar regions as described above with reference to FIGS. 1-9. In this embodiment, the gate electrode 60 is formed as described above. Again, the gate electrode 60 only will be shown for ease of illustration. The capping layer 66, sidewall spacers 74 and LDD regions 76 in the substrate are formed as shown. A polysilicon layer 100 is formed over the gate electrode 60, the exposed regions of the substrate and the field oxide regions 52. The deposition of the polysilicon layer is generally conformal which will cause it to follow the contour of the surface of the wafer as it is deposited. Because of this conformality, the polysilicon layer is deposited to a thickness wherein the lowest most region 102 of the polysilicon layer 100 is above the upper surface 104 of the field oxide regions 52 and preferably above the upper surface 106 of the capping layer 66. A planar sacrificial layer 108, for example, spin-on-glass or photoresist having an etch ratio of 1:1 with the polysilicon layer 100 is formed over the polysilicon layer 100.

Figure 11:
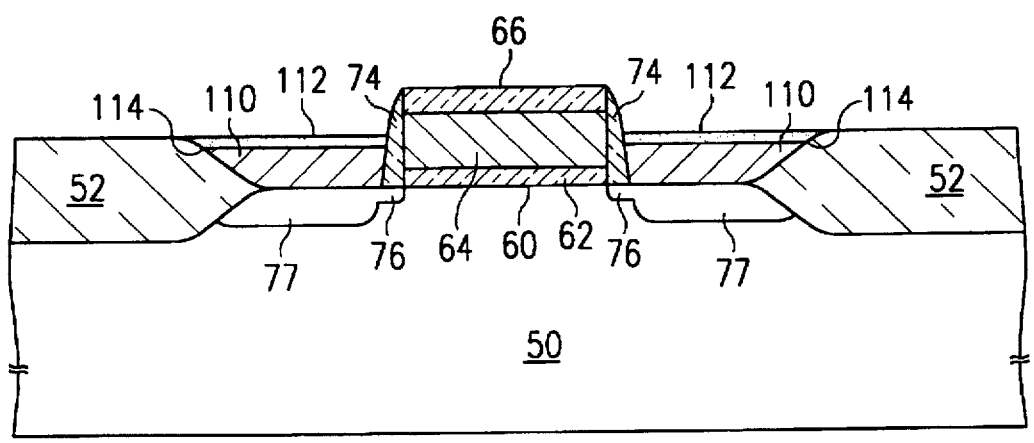

Referring to FIG. 11, an etch of the sacrificial layer 108 and polysilicon layer 100 is performed to expose an upper surface of the field oxide regions 52 thus forming the raised source/drain regions 110 over the LDD regions 76. It is important to note that for a polysilicon raised source/drain, the etch chemistry must be selective to the sacrificial layer 108 and the polysilicon layer 100 etching the sacrificial layer and polysilicon layer at the same rate without substantially etching the underlying layers. The etch may be a wet etch which is selective to the sacrificial layer 108 and the polysilicon layer 100 but not to the sidewall spacers 74, the capping layer 66 or the field oxide regions 52.

The polysilicon raised source/drain regions 110 may also be silicided in a known manner to form a silicide region 112 over the polysilicon 110, for example, by forming a refractory metal over the polysilicon 110 and thermally treating the wafer to react the refractory metal with the underlying polysilicon 110. As with any silicide forming step, the refractory metal may be from the group consisting tantalum, tungsten, titanium and molybdenum. The silicide regions 112 of the polysilicon raised source/drain regions 110 will also lower the resistivity of the raised source/drain regions, while the raised source/drain regions 110 help to prevent any undesired amount of the substrate silicon from being consumed, reducing the possibility of junction leakage and punchthrough.

The sidewall spacers 74 and capping layer 66 will help to electrically isolate the raised source/drain regions 110 from the gate electrode 60 of the transistor. The more heavily doped source/drain regions 77, as shown in FIG. 11 may be formed, however, they may not be necessary. The polysilicon raised source/drain regions 110 are preferably doped after deposition so that the n-type source/drain regions may be doped separately from the p-type doped regions through masking steps. In so doing, the dopants implanted into the polysilicon raised source/drain regions 110 may be driven into the substrate as deep or deeper than the LDD regions depending upon the implant dosage and energy level used to dope the raised source/drain regions. For example, phosphorous may be implanted into n-type raised source/drain regions at a dosage of approximately $6 \times 10^{15}/cm^2$ at 40 KeV and $BF_2$ may be implanted into p-type raised source/drain regions at a dosage of approximately $6 \times 10^{15}/cm^2$ at 40 KeV.

As with the grown epitaxy, the raised source/drain regions provide for more thermal stability for subsequent high temperature processing steps as compared to a conventional salicide process. Also, as with the grown epitaxial raised source/drain regions described above, this alternative embodiment will provide for a more planar device for subsequent processing steps. In contrast with the epitaxial raised source/drain regions, the polysilicon raised source/drain regions may provide additional planarization at regions 114 as it extends over the field oxide regions 52. An additional benefit of the polysilicon raised source/drain regions extending over the tapered field oxide regions is that this process will tolerate greater misalignment of subsequent contacts made to the raised source/drain regions and the underlying substrate LDD regions. In the prior art, if misalignment occurred over the field oxide for the contact opening to the substrate, a portion of the field oxide may have been etched away increasing the likelihood of junction leakage and punchthrough problems. The polysilicon raised source/drain regions will decrease the possibility of these problems occurring.

With each embodiment described, there needs to be a minimum thickness of the capping layer and sidewall oxide spacers to maintain adequate distance between the raised source and drain regions from the transistor gate electrode. This distance will insure the necessary electrical isolation of the devices and maintain device integrity.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of forming a semiconductor integrated circuit, comprising the steps of:

forming a gate electrode over a gate oxide overlying a substrate, wherein the gate electrode is electrically isolated by a plurality of field oxide regions, forming a capping layer over the gate electrode;

forming LDD regions in the substrate adjacent to the gate electrode;

forming sidewall spacers adjacent to the gate electrode and capping layer; and forming substantially planar doped polysilicon raised source/drain regions over the LDD regions and adjacent to the sidewall spacers.

2. The method of claim 1, wherein the capping layer comprises oxide.

3. The method of claim 1, wherein the capping layer comprises nitride.

4. The method of claim 1, wherein the sidewall spacers comprise oxide.

5. The method of claim 1, further comprising the step of:

forming a silicide layer over the substantially planar doped polysilicon raised source/drain regions.

6. The method of claim 5, wherein the silicide layer is formed from the group consisting of titanium, tungsten, tantalum and molybdenum silicides.

7. The method of claim 1, wherein the step of forming a substantially planar doped polysilicon raised source/drain region comprises the steps of:

depositing a polysilicon layer over the gate electrode, substrate and field oxide regions, wherein the lowest most portion of the upper surface of the polysilicon layer is above the upper surface of the field oxide regions;

forming a planar sacrificial layer over the polysilicon layer having a 1:1 etch ratio with the polysilicon layer;

performing an etchback of the sacrificial and the polysilicon layers exposing the upper surface of the field oxides, wherein a portion of the polysilicon remains over a portion of the upper surface of the field oxides; and doping the polysilicon.

8. The method of claim 7, wherein the polysilicon is doped after the etchback step is performed.

9. The method of claim 7, wherein the lowest most portion of the upper surface of the polysilicon layer is above the upper surface of the capping layer.

10. The method of claim 7, wherein the step of doping the polysilicon layer increases the depth of the LDD region in the substrate.

11. The method of claim 7, wherein the planar sacrificial layer comprises spin-on-glass.

12. The method of claim 7, wherein the planar sacrificial layer comprises photoresist.

13. The method of claim 1, wherein the substantially planar polysilicon raised source/drain regions extend over a portion of the upper surface of the field oxide regions.

14. The method of claim 1, further comprising the step of:
forming more heavily doped source/drain regions in the substrate adjacent the gate electrode.

15. A method of forming a semiconductor integrated circuit, comprising the steps of:
forming a gate electrode over a gate oxide overlying a substrate, wherein the gate electrode is electrically isolated by a plurality of field oxide regions,
forming a capping layer over the gate electrode;
forming LDD regions in the substrate adjacent to the gate electrode;
forming sidewall spacers adjacent to the gate electrode and capping layer;
depositing a polysilicon layer over the capping layer, substrate and field oxide regions, wherein the lowest most portion of the upper surface of the polysilicon layer is above the upper surface of the field oxide regions;
forming a planar sacrificial layer over the polysilicon layer having a 1:1 etch ratio with the polysilicon layer;
performing an etchback of the sacrificial and the polysilicon layers exposing the upper surface of the field oxides; and
doping the polysilicon.

16. The method of claim 15, wherein the polysilicon is doped after the etchback step is performed.

17. The method of claim 15, wherein the lowest most portion of the upper surface of the polysilicon layer is above the upper surface of the capping layer.

18. The method of claim 15, wherein the step of doping the polysilicon layer increases the depth of the LDD region in the substrate.

19. The method of claim 15, wherein the planar sacrificial layer comprises spin-on-glass.

20. The method of claim 15 wherein the planar sacrificial layer comprises photoresist.

21. The method of claim 15, wherein the polysilicon raised source/drain regions extend over a portion of the upper surface of the field oxide regions.

* * * * *